US007741812B2

(12) United States Patent
Ukon

(10) Patent No.: US 7,741,812 B2
(45) Date of Patent: Jun. 22, 2010

(54) BATTERY CHARGING APPARATUS INCLUDING NOTIFICATION CONTROL UNIT

(75) Inventor: Tsutomu Ukon, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 411 days.

(21) Appl. No.: 11/275,691

(22) Filed: Jan. 24, 2006

(65) Prior Publication Data

US 2006/0164043 A1 Jul. 27, 2006

(30) Foreign Application Priority Data

Jan. 26, 2005 (JP) ............................ 2005-018699

(51) Int. Cl.
*H02J 7/00* (2006.01)

(52) U.S. Cl. ...................................................... 320/132

(58) Field of Classification Search ................. 320/106, 320/132, 134, 157, 161, 162, DIG. 12, DIG. 13
See application file for complete search history.

(56) References Cited

U.S. PATENT DOCUMENTS

| | | | | |
|---|---|---|---|---|
| 5,479,486 | A | 12/1995 | Saji | |
| 5,726,555 | A | 3/1998 | Takamoro | |
| 5,760,720 | A | 6/1998 | Nolan et al. | |
| 6,137,264 | A * | 10/2000 | Downs et al. | 320/133 |
| 6,495,992 | B1 * | 12/2002 | Pavlovic | 320/161 |
| 2004/0196006 | A1 | 10/2004 | Kawaguchi et al. | |
| 2005/0046390 | A1 * | 3/2005 | Kimura | 320/132 |

FOREIGN PATENT DOCUMENTS

| | | | |
|---|---|---|---|
| JP | S64-005333 | A | 1/1989 |
| JP | H01-191064 | A | 8/1989 |
| JP | 2582648 | B2 | 6/1991 |
| JP | 8-307340 | A | 11/1996 |
| JP | H08-298728 | A | 11/1996 |
| JP | H09-007642 | A | 1/1997 |
| JP | H10-062457 | A | 3/1998 |
| JP | 10-173741 | A | 6/1998 |

(Continued)

OTHER PUBLICATIONS

Machine Translation for (JP 2003164071 A).*

(Continued)

*Primary Examiner*—Edward Tso
*Assistant Examiner*—Ramy Ramadan
(74) *Attorney, Agent, or Firm*—Baker Botts, LLP.

(57) ABSTRACT

An electronic apparatus including: a battery; a notification unit; a storage unit that stores a reference charging time and a reference battery voltage which are values according to charging characteristics of the battery and are used as determination reference values to determine whether or not the battery is normally charged; a charged state determination unit that determines whether or not the charging voltage is applied to the battery; a voltage detection unit that detects a voltage of the battery; and a notification control unit that controls the notification unit to make a notification indicating an abnormal state, when the voltage of the battery detected by the voltage detection unit does not reach the reference battery voltage, even though a condition where the charged state determination unit determines that the charging voltage is applied to the battery continues for the reference charging time.

4 Claims, 11 Drawing Sheets

FOREIGN PATENT DOCUMENTS

| | | | | |
|---|---|---|---|---|
| JP | H10-508460 | A | | 8/1998 |
| JP | 10-243061 | A | | 9/1998 |
| JP | 2001147244 | A | | 5/2001 |
| JP | 2002-101566 | A | | 4/2002 |
| JP | 2002314639 | A | | 10/2002 |
| JP | 2003-087980 | A | | 3/2003 |
| JP | 2003-164071 | A | | 6/2003 |
| JP | 2003164071 | A | * | 6/2003 |
| JP | 2004053397 | A | | 2/2004 |

OTHER PUBLICATIONS

Japanese Patent Office, Office Action in Priority Japanese Patent Application No. 2005-018699, mailed Feb. 13, 2007.

European Patent Office, European Search Report in EP Appl'n No. 06250447.7-2207 (couterpart to above-captioned patent appl'n) mailed Aug. 21, 2006.

Japanese Patent Office, Office Action in Japanese Patent Appl'n No. 2005-018699 (counterpart to above-captioned U.S. Patent appl'n), mailed Jul. 17, 2007.

* cited by examiner

BATTERY CHARGING APPARATUS INCLUDING NOTIFICATION CONTROL UNIT

CROSS REFERENCE TO RELATED APPLICATION

This application claims priority from Japanese Patent Application No. 2005-018699, filed on Jan. 26, 2005, the entire subject matter of which is incorporated herein by reference.

TECHNICAL FIELD

Aspects of the present invention relate to an electronic apparatus with a secondary battery as a power sources.

BACKGROUND

Conventionally, an electronic apparatus having a secondary battery chargeable from the outside as the power source is well known. Generally, a radio telephone capable of a telephone call by radio, such as a cordless mobile device provided for the telephone set or a portable telephone employs a secondary battery as the power source. When the secondary battery is charged, the radio telephone itself is set on a battery charger. Thereby, the charging terminal of the radio telephone set and the charging terminal of the battery charger are contacted and electrically connected to charge the secondary battery from the charging stand.

In such charging, if there occurs a contact failure due to a dirt interposed between the charging terminal of the radio telephone set and the charging terminal of the battery charger, for example, a situation arises where the secondary battery is not actually charged, though the radio telephone set is set in the battery charger. Thus, when the charging of the secondary battery is not detected, even though the radio telephone set is set in the battery charger, the radio telephone set may be vibrated by driving a vibrator motor built in the radio telephone set, removing the dirt sticking to the charging terminal, and cleaning a corroded portion of the charging terminal (refer to JP-A-10-173741).

SUMMARY

By the way, if no charging current flows even though the radio telephone set is set in the battery charger, an abnormal condition such as a contact failure can be easily detected. On the other hand, for example, to detect an abnormal condition that the charging current flows but the current value is lower due to electrical resistance caused by a contaminant of the charging terminal, it is necessary to make a judgment based on the degree of rise in the voltage of the secondary battery after the charging is performed continually to some extent.

However, since the charging characteristics are different with the kind of secondary battery, a correct judgment may not be made on the basis of the charging characteristics of the certain secondary battery, if another kind of secondary battery is employed. In some cases, the secondary battery maybe judged as abnormal, even though it is normally charged.

This invention provides an electronic apparatus that judges correctly whether or not the secondary battery is not normally charged.

According to an aspect of the invention, there is provided an electronic apparatus having a secondary battery as a power source, which is chargeable by applying a charging voltage from the outside. The charging voltage may be applied not only by a contact charging method but also a noncontact charging method (contactless charging method).

This electronic apparatus also has a notification unit, a storage unit, a charged state determination unit, a voltage detection unit and a notification control unit.

The notification unit notifies information to a user. Specifically, a display unit that notifies (displays) the information in visible form (e.g., LCD that displays the characters or graphics, LED that lights up or flashes on and off), and a sound output unit that notifies the information by sound (e.g., a speaker that outputs voice, melody, buzzer) may be employed.

The storage unit can store information inputted from the outside, and store the values according to the charging characteristics of the secondary battery, which are a reference charging time and a reference battery voltage useful as determination reference values to determine whether or not the secondary battery is normally charged. The storage unit that can store the information inputted from the outside may be a non-volatile storage medium (e.g., EEPROM or flash memory) capable of rewriting the information (inputting or erasing the information), or a non-volatile storage medium only capable of writing the information (inputting the information).

The charged state determination unit determines whether or not the charging voltage is applied to the secondary battery.

The voltage detection unit detects a voltage of the secondary battery.

The notification control unit controls the notification unit to make a notification indicating an abnormal state, when the voltage of the secondary battery detected by the voltage detection unit does not reach the reference battery voltage stored in the storage unit, even though a condition where the charged state determination unit determines that the charging voltage is applied to the secondary battery continues for the reference charging time stored in the storage unit. Herein, the notification indicating the abnormal state may be the display of a message or graphic indicating the abnormal state, or the output of sound or buzzer indicating the abnormal state. Besides, the notification may be a pictograph indicating the charged amount (remaining amount) of the secondary battery, which is made to indicate no full charge.

In this way, the electronic apparatus informs the user of the abnormal state, when the voltage of the secondary battery does not reach the reference battery voltage, even though the charging voltage is applied to the secondary battery continually for the reference charging time. Therefore, with this electronic apparatus, when the secondary battery is not normally charged due to a dirt of the terminal for applying the charging voltage or deterioration of the secondary battery itself, even though the charging voltage is applied, the user is informed of the abnormal state to be coped with.

Particularly, in the electronic apparatus, the storage unit for storing the reference charging time and the reference charging voltage can store the information inputted from the outside, whereby the electronic apparatus with different kinds of secondary battery can be manufactured employing common storage unit. That is, with the constitution employing the storage unit incapable of newly storing the information, when the electronic apparatus with different kinds of secondary battery is manufactured, it is required to employ dedicated storage unit storing beforehand the reference charging time and the reference battery voltage corresponding to each secondary battery, whereby the components cannot be shared. On the contrary, with the electronic apparatus of this invention, even if the common storage unit is employed, the reference charging time and the reference battery voltage corresponding to each secondary battery can be stored at the shipment of factory. Therefore, the manufacture cost of the electronic apparatus with different kinds of secondary battery can be reduced. Further, even when the secondary battery is replaced with different kind of secondary battery, the reference charging time and the reference battery voltage corresponding to the secondary battery can be stored. As a result, it is possible to correctly judge whether or not the secondary battery is not normally charged for plural kinds of secondary battery.

Another aspect of the invention provides an electronic apparatus having, like the above-mentioned electronic apparatus, a secondary battery as a power source, which is chargeable by applying a charging voltage from the outside.

This electronic apparatus includes a notification unit, a storage unit, a selection unit, a charged state determination unit, a voltage detection unit and a notification control unit.

The notification unit notifies the information to the user as in the above-mentioned electronic apparatus.

The storage unit stores reference charging times and reference battery voltages which are values according to charging characteristics of plural kinds of secondary battery and are used as determination reference values to determined whether or not the secondary battery is normally charged. Namely, the storage unit stores the reference charging voltages and the reference battery voltages for plural kinds of secondary battery. The storage unit maybe a non-volatile storage medium (e.g., EEPROM or flash memory) capable of rewriting the information, a non-volatile storage medium only capable of writing the information, or a storage medium incapable of writing the information (e.g., ROM).

The selection unit selects the reference charging time and the reference battery voltage corresponding to the secondary battery from the reference charging times and the reference battery voltages for plural kinds of secondary battery, which are stored in the storage unit. Specifically, the reference charging time and the reference battery voltage corresponding to the secondary battery may be selected, based on an input operation by the user (i.e., they are selected by the user). In this way, the reference charging time and the reference battery voltage corresponding to the secondary battery can be easily selected.

The charged state determination unit determines whether or not the charging voltage is applied to the secondary battery.

The voltage detection unit detects a voltage of the secondary battery.

The notification control unit controls the notification unit to make a notification indicating an abnormal state, when the voltage of the secondary battery detected by the voltage detection unit does not reach the reference battery voltage selected by the selection unit, even though a condition where the charged state determination unit determines that the charging voltage is applied to the secondary battery continues for the reference charging time selected by the selection unit. Herein, examples of the notification indicating the abnormal state have been given in the explanation of the above-mentioned electronic apparatus.

In this way, the electronic apparatus informs the user of the abnormal state, when the voltage of the secondary battery does not reach the reference battery voltage, even though the charging voltage is applied to the secondary battery continually for the reference charging time. Therefore, with this electronic apparatus, if the secondary battery is not normally charged due to a dirt of the terminal for applying the charging voltage or deterioration of the secondary battery itself, even though the charging voltage is applied, the user is informed of the abnormal state to be coped with.

Particularly, in the electronic apparatus, the reference charging times and the reference charging voltages for plural kinds of secondary battery are stored in the storage unit, and the values corresponding to the secondary battery are selected from among them, whereby the electronic apparatus with different kinds of secondary battery can be manufactured employing the common storage unit. That is, with the constitution employing the storage unit storing only the reference charging time and the reference charging voltage for one kind of secondary battery, when the electronic apparatus with a different kind of secondary battery is manufactured, it is required to employ dedicated storage unit storing the reference charging time and the reference battery voltage corresponding to each secondary battery, whereby the components cannot be shared. On the contrary, with the electronic apparatus of this invention, even if the common storage unit is employed, the reference charging time and the reference battery voltage corresponding to the secondary battery are selected and the values according to each secondary battery are obtained. Therefore, the manufacture cost of the electronic apparatus with different kinds of secondary battery can be reduced. Further, even when the secondary battery is replaced with different kind of secondary battery, the reference charging time and the reference battery voltage corresponding to the secondary battery can be selected. As a result, it is possible to correctly judge whether or not the secondary battery is not normally charged for plural kinds of secondary battery.

BRIEF DESCRIPTION OF THE DRAWINGS

Illustrative aspects of the invention may be more readily described with reference to the accompanying drawings.

DETAILED DESCRIPTION

Aspects of the present invention will be described below with reference to the drawings.

Figure 1:
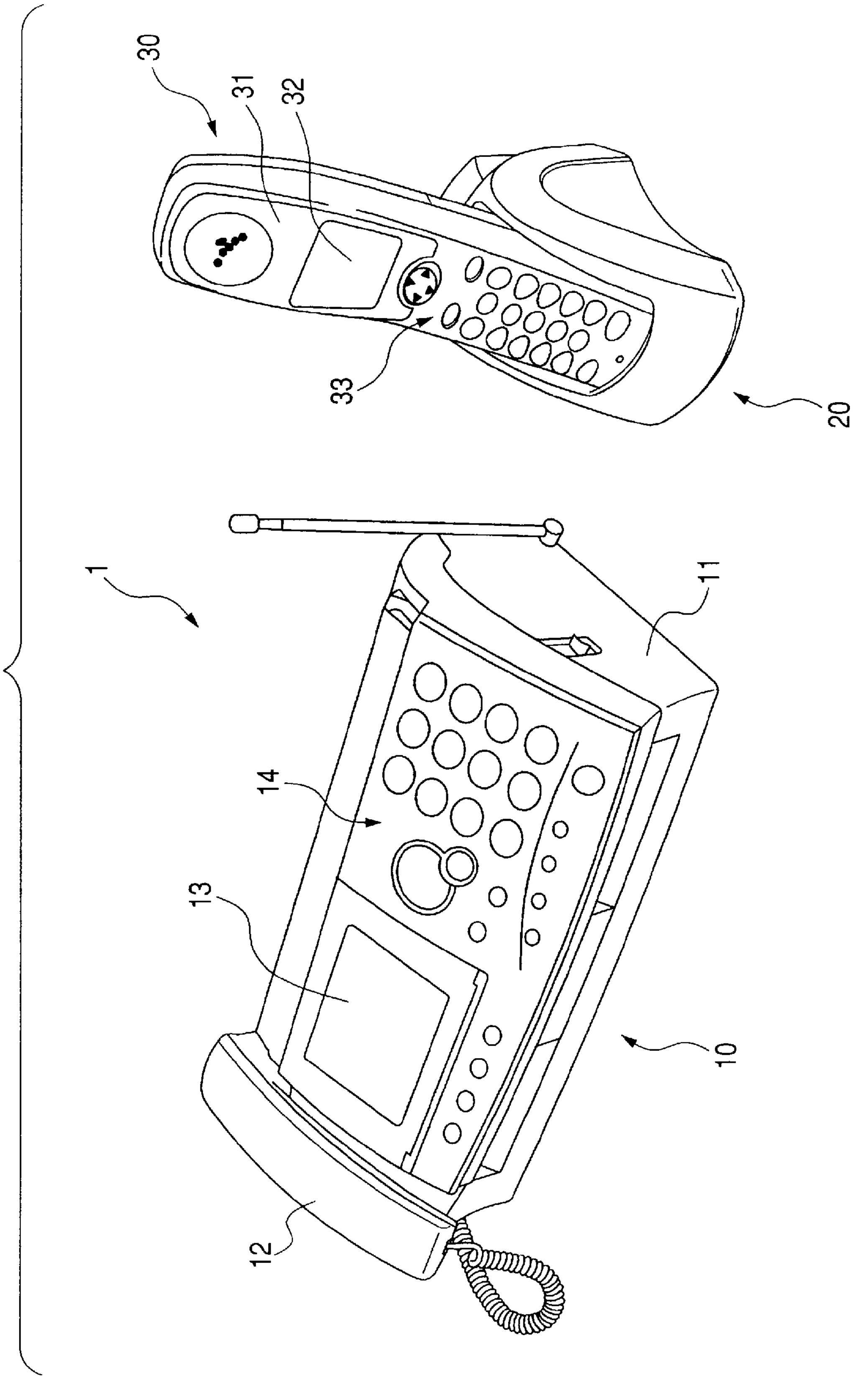
FIG. 1 is a perspective view of a telephone set having a mobile device according to an aspect of the present invention.

FIG. 1 is a perspective view of a telephone set with facsimile function (hereinafter simply referred to as a "telephone set") 1 having a cordless mobile device (hereinafter simply referred to as a "mobile device") 30 as an electronic apparatus according to an aspect of the invention. Also, FIG. 2 is a perspective view showing the mobile device 30 and a charging stand (battery charger) 20.

This telephone set 1 includes a main device 10 connected to a public switched telephone network (PSTN), a mobile device 30 for making the radio communication with the main device 10, and a charging stand 20, capable of laying the mobile device 30, for charging the mobile device 30 laid thereon, as shown in FIG. 1.

A handset 12 that is a transmitter-receiver is attached on the side portion of a main case 11 of the main device 10. Moreover, a display part 13 for displaying various kinds of information on the liquid crystal display (LCD), and an operation part 14 having a plurality of keys arranged to output an electrical signal by detecting an input operation by the user are provided on an upper face of the main case 11.

Also, the mobile device 30 includes a display panel 32 for displaying various kinds of information on the liquid crystal display (LCD) and an operation part 33 having a plurality of keys arranged to output an electrical signal by detecting an input operation by the user in the main case 31 having a shape of handset. Moreover, the mobile device 30 includes as shown in FIG. 2A, a charging terminal 34 for applying a charging voltage from the charging stand 20 to a secondary battery 43 (see FIG. 3) as the power source.

Figure 2B:
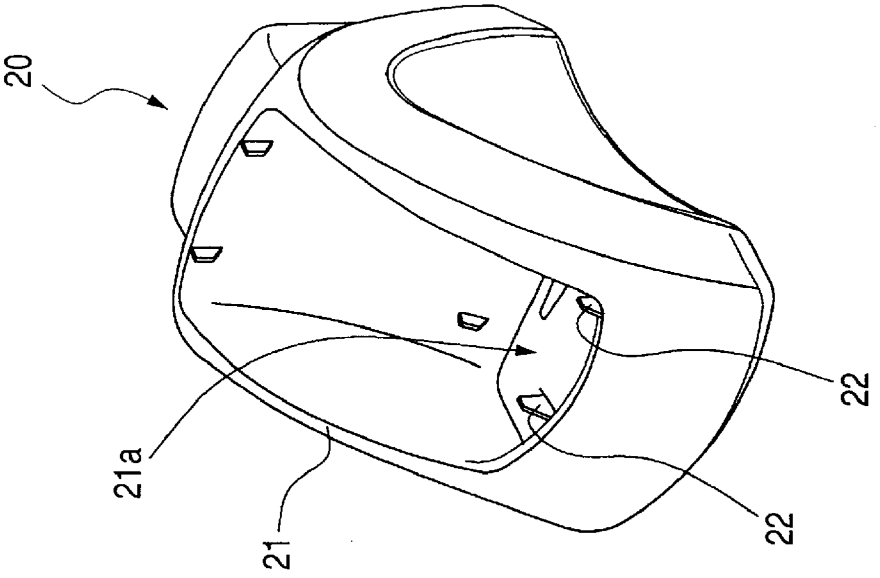
FIG. 2 is a perspective view of the mobile device and a charging stand.
Figure 2A:
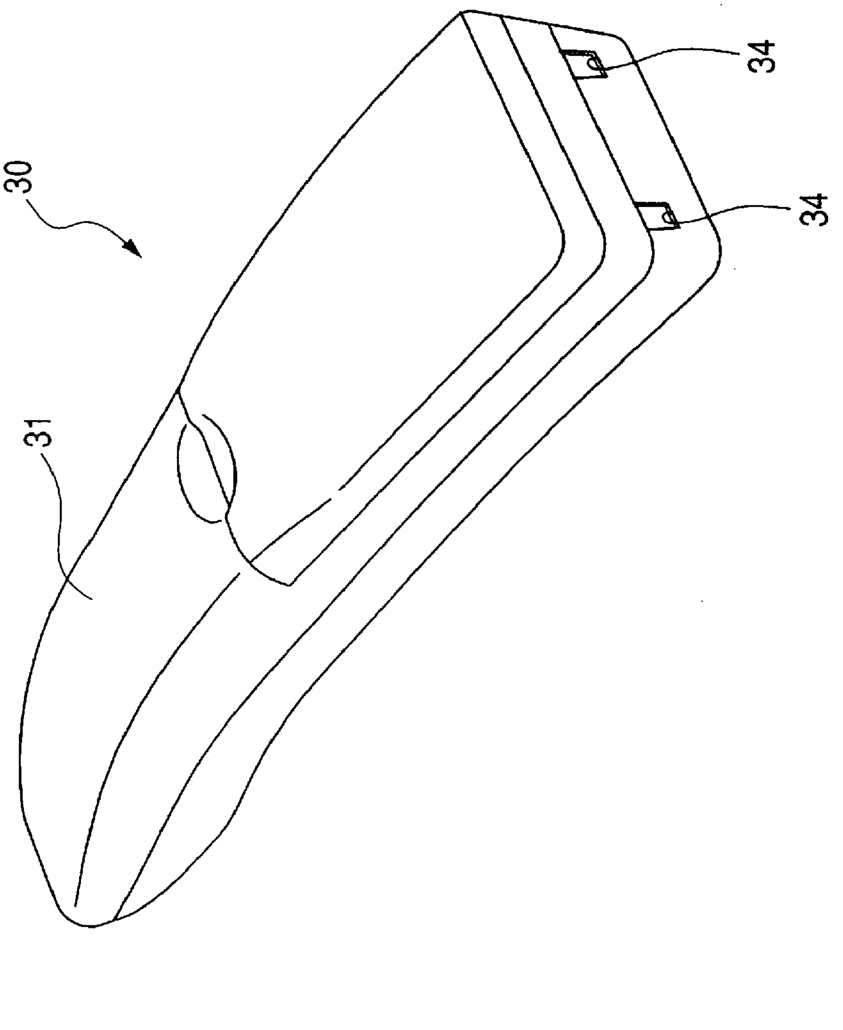

On the other hand, the charging stand 20 includes, as shown in FIG. 2B, a charging stand main body 21 formed with a laying concave portion 21*a* on which the mobile device 30 is detachably laid, and a charging terminal 22, provided within the laying concave portion 21*a*, for making contact with a charging terminal 34 of the mobile device when the mobile device 30 is laid on the laying concave portion 21*a*.

Referring to a block diagram of FIG. 3, the internal configuration of the mobile device 30 and the charging stand 20 will be described below.

Figure 3:
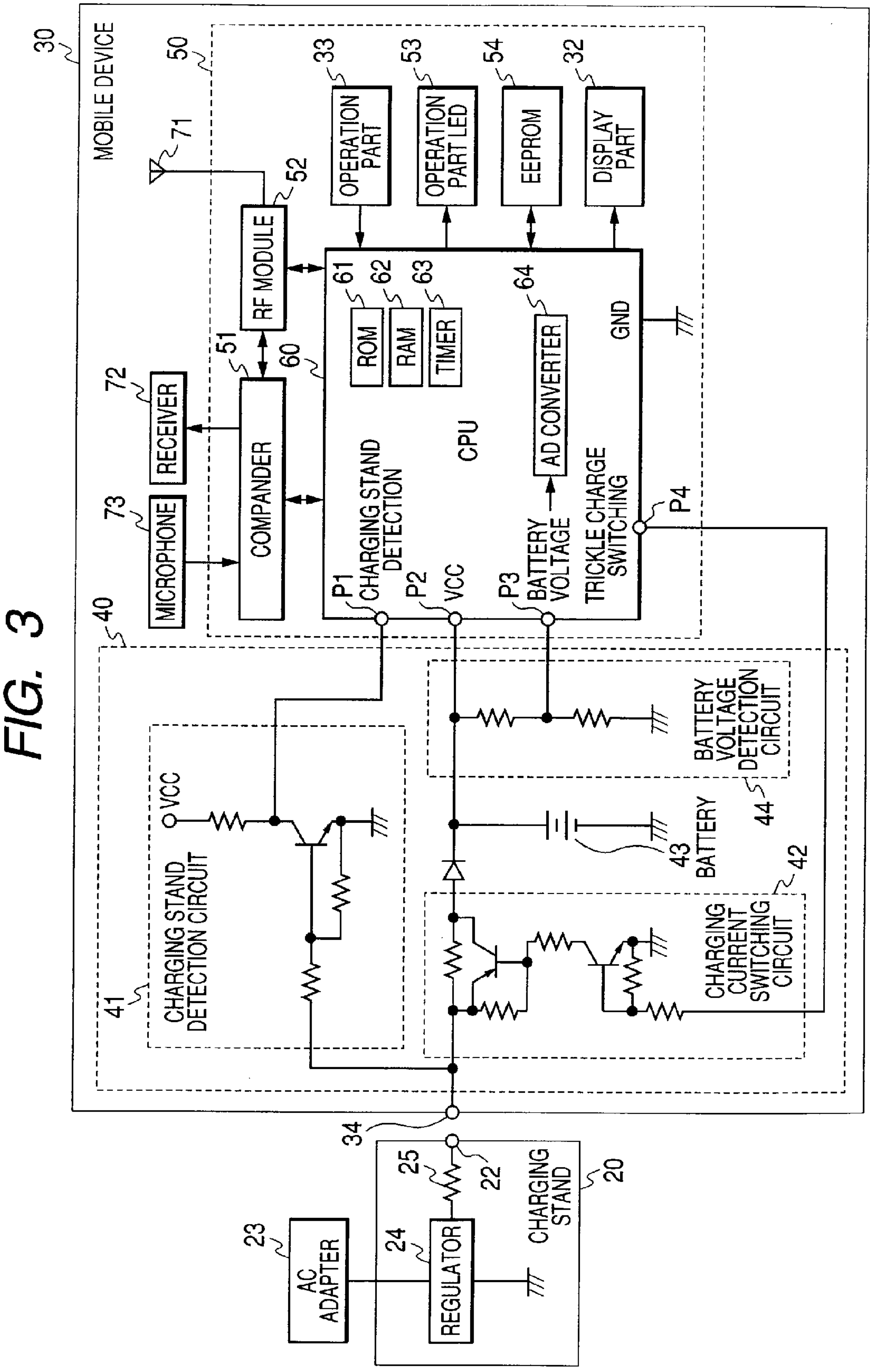
FIG. 3 is a block diagram showing the internal configuration of the mobile device and the charging stand.

The mobile device 30 includes a charging part 40, a radio communication part 50, an antenna 71, a receiver 72 and a microphone 73, as shown in FIG. 3.

The charging part 40 includes a charging stand detection circuit 41, a charging current switching circuit 42, a secondary battery 43 and a battery voltage detection circuit 44.

The charging stand detection circuit 41 is the circuit for enabling a CPU 60 to detect whether or not a charging voltage is applied via the charging terminal 34 from the charging stand 20 (i.e., during charging).

The charging current switching circuit 42 is the circuit for switching the magnitude of the charging current supplied via the charging terminal 34 from the charging stand 20. Specifically, it switches the magnitude of the charging current at two stages (boosting charge, trickle charge) depending on the output voltage from the CPU 60.

The secondary battery 43 is employed as the power source for generating an operation power for each part of the mobile device 30. In this embodiment, the secondary battery is chargeable/dischargeable battery of nickel-cadmium type as well known, and has a characteristic that the output voltage at full charge is 2.8V.

The battery voltage detection circuit 44 is the circuit for enabling the CPU 60 to detect the voltage of the secondary battery 43.

The radio communication part 50 includes the CPU 60, a compander 51, an RF module 52, an operation LED 53, an EEPROM 54, the display part 32 and the operation part 33.

The CPU 60 has a ROM 61, a RAM 62, a timer 63 and an A/D converter 64, and controls each part of the mobile device 30 by reading and executing a program stored in the ROM 61. Also, the CPU 60 is provided with a port (charging stand detecting port P1) for inputting the output voltage from the charging stand detection circuit 41, a port (VCC port P2) for inputting the operation voltage for operating the CPU 60, a port (battery voltage port P3) for inputting the output voltage from the battery voltage detection circuit 44, and a port (trickle charge switching port P4) for outputting the voltage of switching the boosting charge and the trickle charge to the charging current switching circuit 42. The voltage inputted into the battery voltage port P3 is inputted into the AD converter 64, and converted into digital value (A/D conversion), whereby the voltage of the secondary battery 43 can be recognized.

The compander 51 has a function of reducing the noise of the voice signal inputted from the microphone 73 and the voice signal outputted to the receiver 72, based on a command from the CPU 60, for the user to listen more easily.

The RF module 52 has a function of taking out a voice signal from the electric wave received by the antenna 71 and sending it to the compander 51, based on a command from the CPU 60, and converting the voice signal sent from the compador 51 into electric wave to be sent out from the antenna 71.

The operation part LED 53 is the LED for illuminating each key of the operation part 33 to be visible for the user in the dark.

The EEPROM 54 is a well-known non-volatile storage medium in which data is electrically erasable and writable. In the mobile device 30 of this aspect, the EEPROM 54 stores various kinds of determination reference values for use in the process as will be described later. Specifically, a battery voltage determination threshold value H useful for determining the battery remaining amount of the secondary battery 43, a reference charging time T used as the determination reference value as to whether or not the secondary battery 43 is normally charged, and a reference battery voltage V are stored.

Herein, the battery voltage determination threshold value H is a digital value indicating a voltage of 2.3V, which is employed for comparison with the value (digital value indicating the voltage of the secondary battery 43) inputted into the battery voltage port P3 of the CPU 60 and A/D converted by the AD converter 64 in the process performed by the CPU 60 as will be described later (FIGS. 6 and 12), whereby it is determined whether or not the voltage of the secondary battery 43 is greater than or equal to 2.3V.

Also, the battery voltage determination threshold value H is written into the EEPROM 54 at the shipment of the mobile device 30 from the factory to have the value including dispersion for every product. That is, since plural mobile devices 30 manufactured as the product contain some manufacturing dispersion, even if a voltage of fixed value is inputted into the battery voltage port P3 of the CPU 60 for each mobile device 30, the value obtained by A/D converting it may contain some dispersion depending on the characteristic of each product. Therefore, if the predetermined battery voltage determination threshold value H is stored for each product, there is dispersion between products in the determination employing the battery voltage threshold value H. Thus, a voltage of 2.3V generated by a stabilized power supply may be applied, instead of the voltage of the secondary battery 43. At this time, the CPU 60 performs a process of writing (storing) the value (digital value indicating 2.3V) inputted into the battery voltage port P3 and A/D converted as the battery voltage determination threshold value H into the EEPROM 54 (this process is equivalent to a detected voltage write unit). In this way, the battery voltage determination threshold value H becomes the value including the characteristics of each product by storing it in the EEPROM 54, whereby there is little dispersion between products.

The reference charging time T and the reference battery voltage V stored in the EEPROM 54 are the values according to the charging characteristic of the secondary battery 43. That is, if the charging is continued for the reference charging time T, the reference battery voltage V is the minimum voltage of the secondary battery 43, for which it is determined that the charging is normally made. That is, when the voltage of the secondary battery 43 does not reach the reference battery voltage V even though the secondary battery is charged continually for the reference charging time T, it is determined that the charging is not normally made. Such charging characteristic is different depending on the kind of secondary battery. For example, if the secondary battery 43 is replaced with another kind of secondary battery, the normal determination is not made. Thus, in this aspect, the EEPROM 54 stores beforehand the reference charging times T and the reference battery voltages V of the secondary batteries for a plurality of manufacturers. Specifically, the EEPROM 54 stores the reference charging time T1 and the reference battery voltage V1 of the secondary battery (secondary battery 43 contained when manufactured) for the first maker, and the reference charging time T2 and the reference battery voltage V2 of the secondary battery for the second maker. The user can select the determination reference values, depending on the used secondary battery. In this example, the values for two kinds of secondary battery are stored, but needless to say, three or more kinds of secondary battery may be stored.

The antenna 71 allows the radio communication with the main device 10, and outputs an electric wave of frequency and antenna power permitted for the low power radio station as defined in the Radio Law.

The receiver 72 converts an electrical signal sent from the compander 51 into the voice that the user can hear, and outputs it.

The microphone 73 converts the voice uttered by the user into electrical signal and outputs it to the compander 51.

The charging stand 20 includes the charging terminal 22, a regulator 24 for converting the AC current (7V) outputted from an AC adapter 23 into DC current (4.3V), and a short-circuit protection resistor 25 for protecting the regulator 24 from breakage when the DC current outputted from the regulator 24 is short circuited.

Referring to FIGS. 4A to 4D, the battery remaining amount indication of the secondary battery 43 displayed on the display part 32 will be described below. As shown in FIGS. 4A to 4D, the battery remaining amount indication has four stages.

Figure 4A:
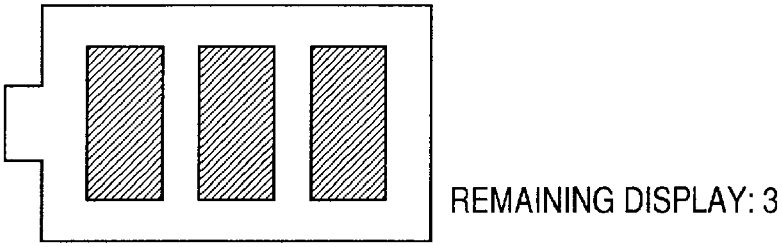
FIGS. 4A to 4D are explanatory views for explaining the battery remaining amount indication.

In a case of FIG. 4A, the remaining amount indication is 3, and displayed when the discharge time Td is 12 hours or less, and the voltage of the secondary battery 43 is 2.38V or more. The state where the remaining amount indication is 3 means that the battery remaining amount is from 30 to 100% of the full charged state.

Figure 4B:
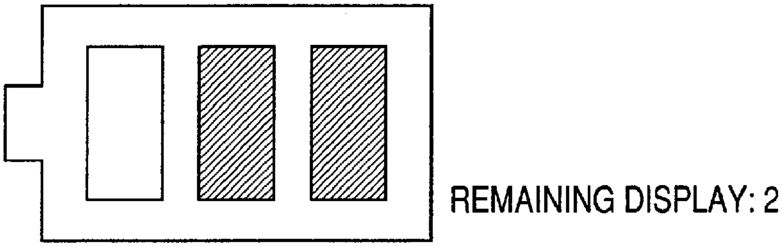

Also, in a case of FIG. 4B, the remaining amount indication is 2, and displayed when the discharge time Td is 12 hours or less and the voltage of the secondary battery 43 is from 2.35V to 2.38V, or when the discharge time Td is from 12 to 13.5 hours and the voltage of the secondary battery 43 is 2.35V or more. The state where the remaining amount indication is 2 means that the battery remaining amount is from 20 to 30% of the full charged state.

Figure 4C:
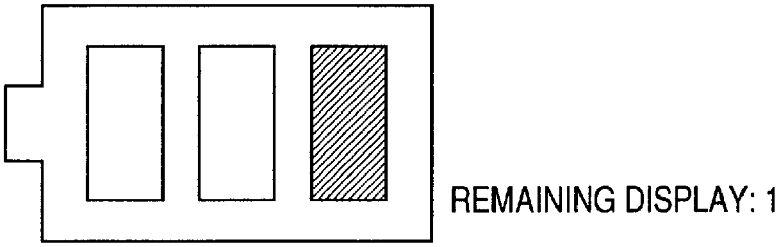

Moreover, in a case of FIG. 4C, the remaining amount indication is 1, and displayed when the discharge time Td is 12 hours or less and the voltage of the secondary battery 43 is from 2.30V to 2.35V, the discharge time Td is from 12 to 13.5 hours and the voltage of the secondary battery 43 is from 2.30V to 2.35V, or the discharge time Td is from 12 to 13.5 hours or more and the voltage of the secondary battery 43 is 2.30V or more. The state where the remaining amount indication is 1 means that the battery remaining amount is from 10 to 20% of the full charged state.

Figure 4D:
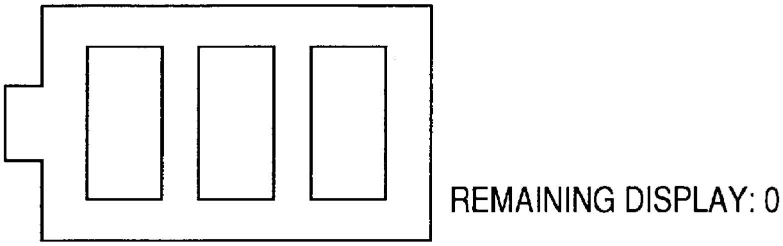

On the other hand, in a case of FIG. 4D, the remaining amount indication is 0, and displayed when the discharge time Td is 12 hours or less and the voltage of the secondary battery 43 is 2.30V or less, the discharge time Td is from 12 to 13.5 hours and the voltage of the secondary battery 43 is 2.30V or less, or the discharge time Td is from 12 to 13.5 hours or more and the voltage of the secondary battery 43 is 2.30V or less. The state where the remaining amount indication is 0 means that the battery remaining amount is from 0 to 10% of the full charged state.

Figure 5:
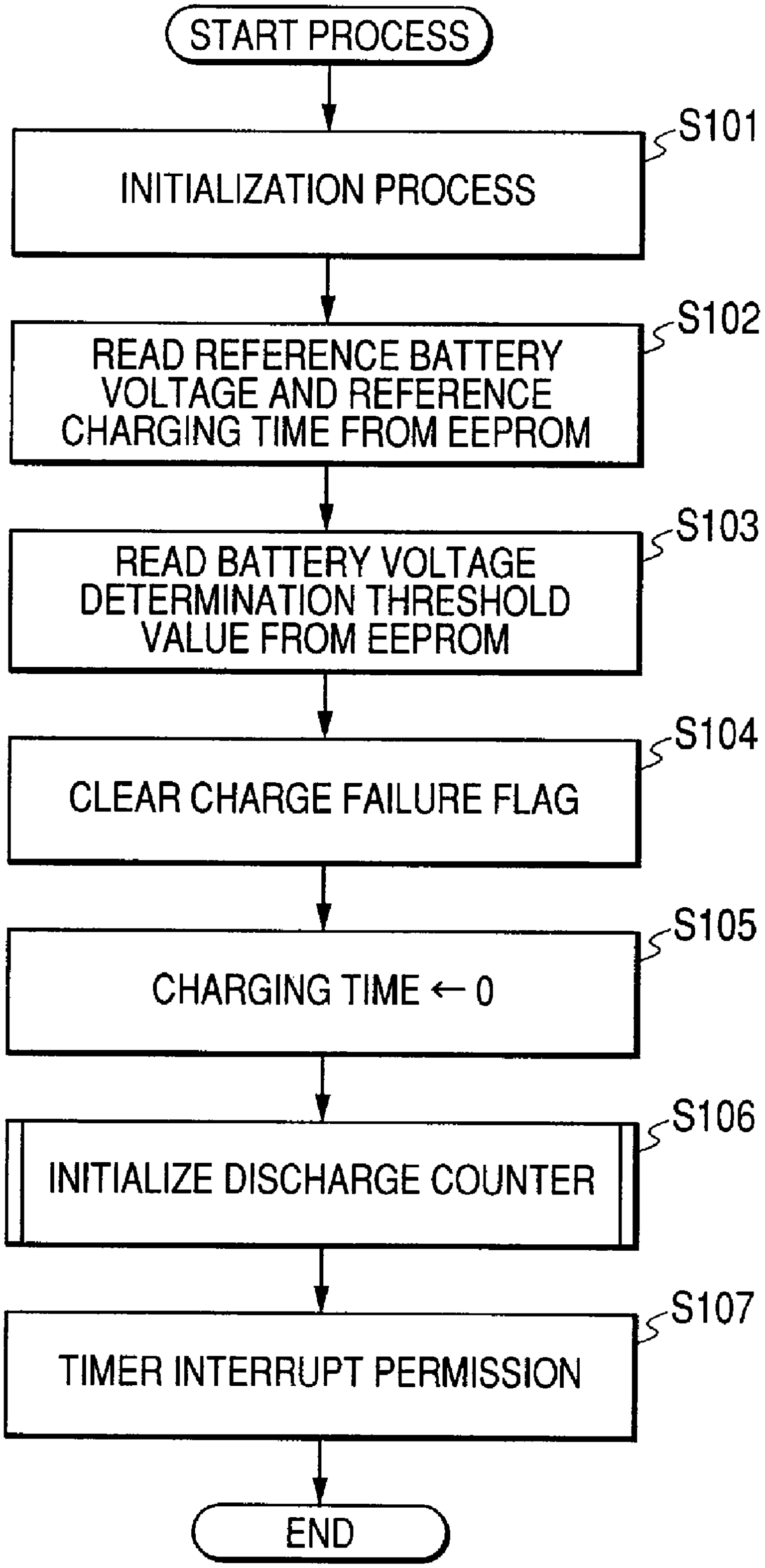
FIG. 5 is a flowchart of a start process.

Various processes performed by the CPU 60 will be described below, Referring to a flowchart of FIG. 5, first of all, a start process performed by the CPU 60 when a power switch of the mobile device 30 is turned on will be described below.

If this start process is started, first of all, an initialization process including setting each port, initializing the RAM, and initiating various kinds of hardware is performed at S101.

At S102, the reference charging time T and the reference charging voltage V (specifically, reference charging time T1 and reference charging voltage V1 of the secondary battery for the first maker) stored in the EEPROM 54 are read and stored as the determination reference value in the RAM 62.

At S103, the battery voltage determination threshold value H stored in the EEPROM 54 is read and stored as the digital value indicating 2.3V in the RAM 62. In the process (FIGS. 6 and 12) as will be described later, the determination reference value of 2.35V or 2.38V is employed other than 2.3V, but these values are calculated based on the voltage ratio with reference to the digital value indicating 2.3V, and stored in the RAM 62. For example, when the digital value indicating 2.3V is 230, the digital value indicating 2.35V is calculated as 235 based on the voltage ratio, and the digital value indicating 2.38V is calculated as 238 based on the voltage ratio.

At S104, a charge failure flag is cleared. This charge failure flag is set when the charging is not normally performed.

At S105, the charging time Tc is reset (to zero). Herein, the charging time Tc is the value of counting the time for which the charging voltage is continually applied from the charging stand 20 and stored in the RAM 62.

Figure 6:
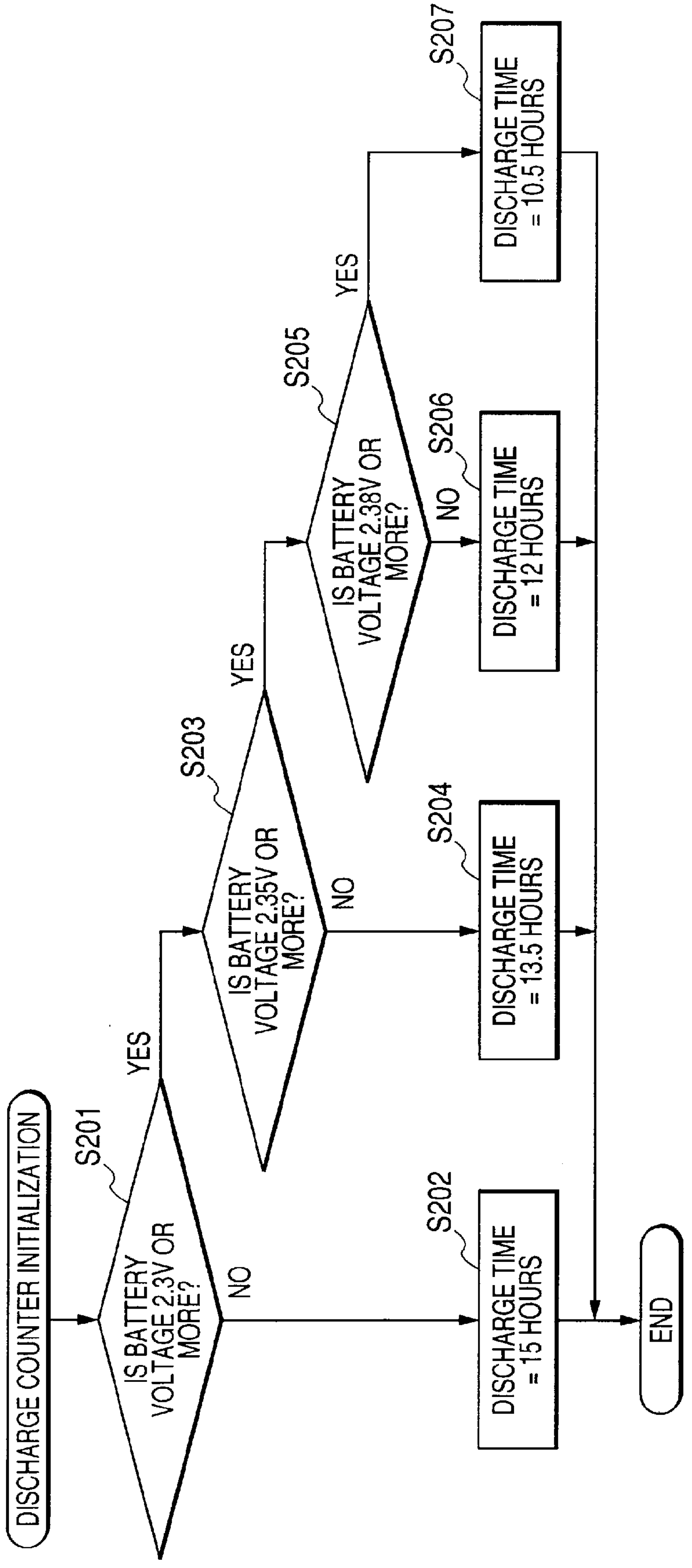
FIG. 6 is a flowchart of a discharge counter initialization process.

At S106, a discharge counter initialization process for setting the initial value of the discharge time Td is performed. The specific contents of the discharge counter initialization process will be described below (FIG. 6).

At S107, a timer interrupt process (FIG. 9) is permitted. Thereafter, this start process is ended.

Referring to a flowchart of FIG. 6, the discharge counter initialization process performed at S106 in the above start process (FIG. 5) will be described below.

When this discharge counter initialization process is started, first of all, a determination is made at S201 whether or not the voltage of the secondary battery 43 is 2.3V or more. Specifically, a determination is made whether or not the value (digital value indicating the voltage of the secondary battery 43) inputted into the battery voltage port P3 and A/D converted by the AD converter 64 is the digital value indicating 2.3V stored in the RAM 62 or more.

When the voltage of the secondary battery 43 is not 2.3V or more (less than 2.3V) at S201, the procedure transfers to S202, where the initial value of the discharge time Td is set to 15 hours, and this discharge counter initialization process is ended. Herein, the discharge time Td is the value indicating the discharge amount of the secondary battery 43 (in other words, the value indicating the charging time required to maximize the charging power of the secondary battery 43 (full charged state)) and stored in the RAM 62. Specifically, the charging time Td=0 indicates the full charged state, and the discharge amount is greater (the charging time required to attain the full charged state is longer) as the value of the discharge time Td is increased.

On the other hand, when the voltage of the secondary battery 43 is 2.3V or more at S201, the procedure transfers to S203 to determine whether or not the voltage of the secondary battery 43 is 2.35V or more. Specifically, a determination is made whether or not the value (digital value indicating the voltage of the secondary battery 43) inputted into the battery voltage port P3 and A/D converted by the AD converter 64 is greater than or equal to the digital value indicating 2.35V stored in the RAM 62.

When the voltage of the secondary battery 43 is not 2.35V (i.e., from 2.3V to 2.35V) at S203, the procedure transfers to S204, where the initial value of the discharge time Td is set to 13.5 hours, and this discharge counter initialization process is ended.

On the other hand, when the voltage of the secondary battery 43 is 2.35V or more at S203, the procedure transfers to S205 to determine whether or not the voltage of the secondary battery 43 is 2.38V or more. Specifically, a determination is made whether or not the value (digital value indicating the voltage of the secondary battery 43) inputted into the battery voltage port P3 and A/D converted by the AD converter 64 is greater than or equal to the digital value indicating 2.38V stored in the RAM 62.

When the voltage of the secondary battery 43 is not 2.38V or more (i.e., from 2.35V to 2.38V) at S205, the procedure transfers to S206, where the initial value of the discharge time Td is set to 12 hours, and this discharge counter initialization process is ended.

On the other hand, when the voltage of the secondary battery 43 is 2.38V or more at S205, the procedure transfers to S207, where the initial value of the discharge time Td is set to 10.5 hours, and this discharge counter initialization process is ended.

That is, in the discharge counter initialization process, when the voltage of the secondary battery 43 is 2.3V or less, front 2.3V to 2.35V, from 2.35V to 2.38V, or 2.38V or more, the initial value of the discharge time Td is set to 15 hours, 13.5 hours, 12 hours, or 10.5 hours, respectively.

Figure 7:
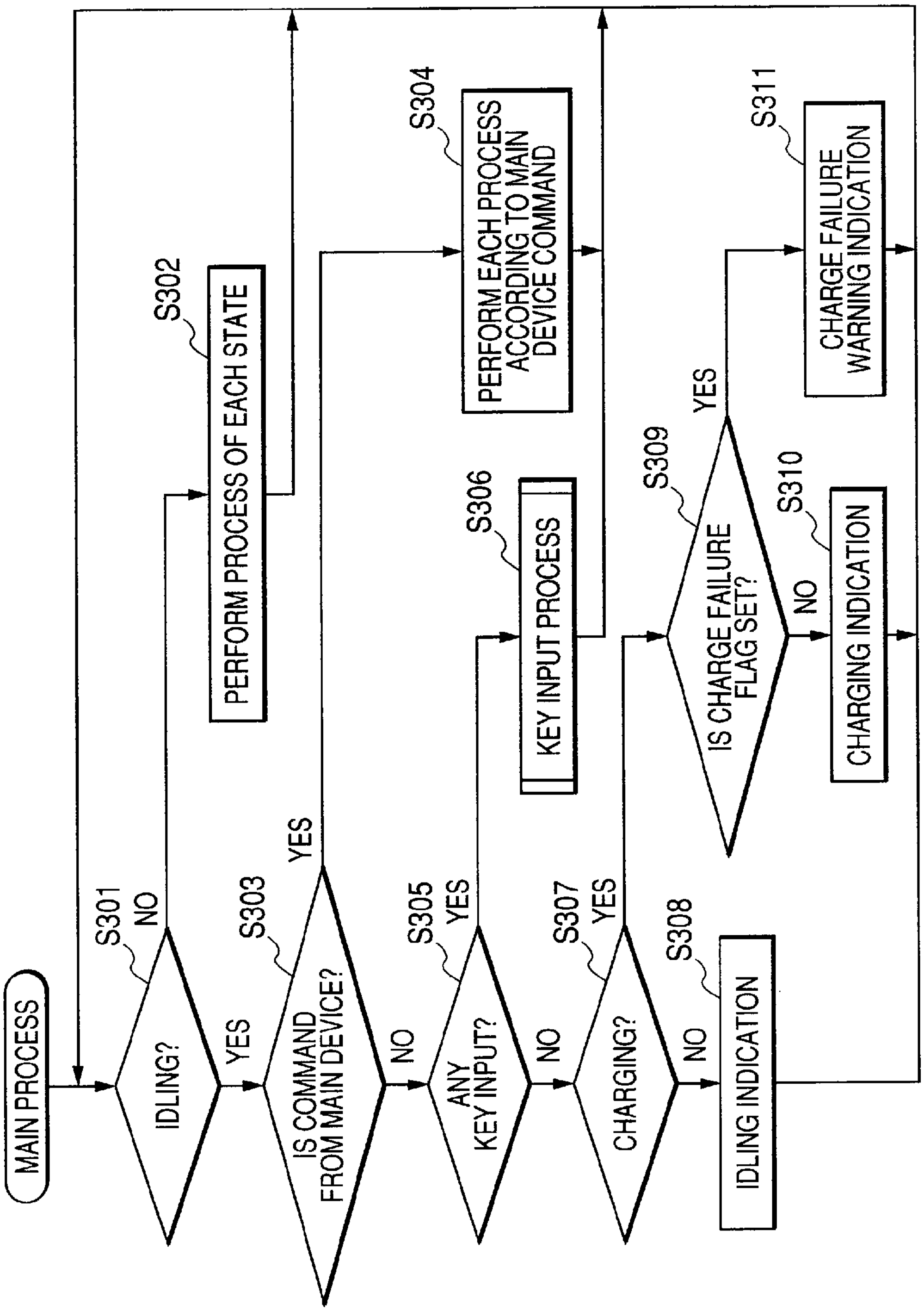
FIG. 7 is a flowchart of a main process.

Referring to a flowchart of FIG. 7, a main process performed when the start process (FIG. 5) is ended will be described below.

If this main process is started, first of all, a determination is made at S301 whether or not the mobile device 30 is in a standby state. Herein, the standby state means the state where the mobile device 30 is not employed (in other words, the power consumption of the secondary battery 43 is the minimum). Conversely, the not standby state is the state where the mobile device 30 is on the telephone call, or the mobile device 30 communicates such as data transfer with the main device 10, for example.

At S301, when the mobile device 30 is not in the standby state (not idling), the procedure transfers to S302 to perform a well-known process corresponding to each state (e.g., a speaking process in a speaking state), and the procedure returns to S301.

On the other hand, when the mobile device 30 is in the standby state at S301, the procedure transfers to S303 to determine whether or not any command is received from the main device 10.

At S303, when any command is received from the main device 10, the procedure transfers to S304 to perform a well-known process in accordance with a command from the main device 10, and the procedure returns to S301.

On the other hand, at S303, when any command is not received from the main device 10, the procedure transfers to S305 to determine whether or not any input operation is performed in the operation part 33.

Figure 8:
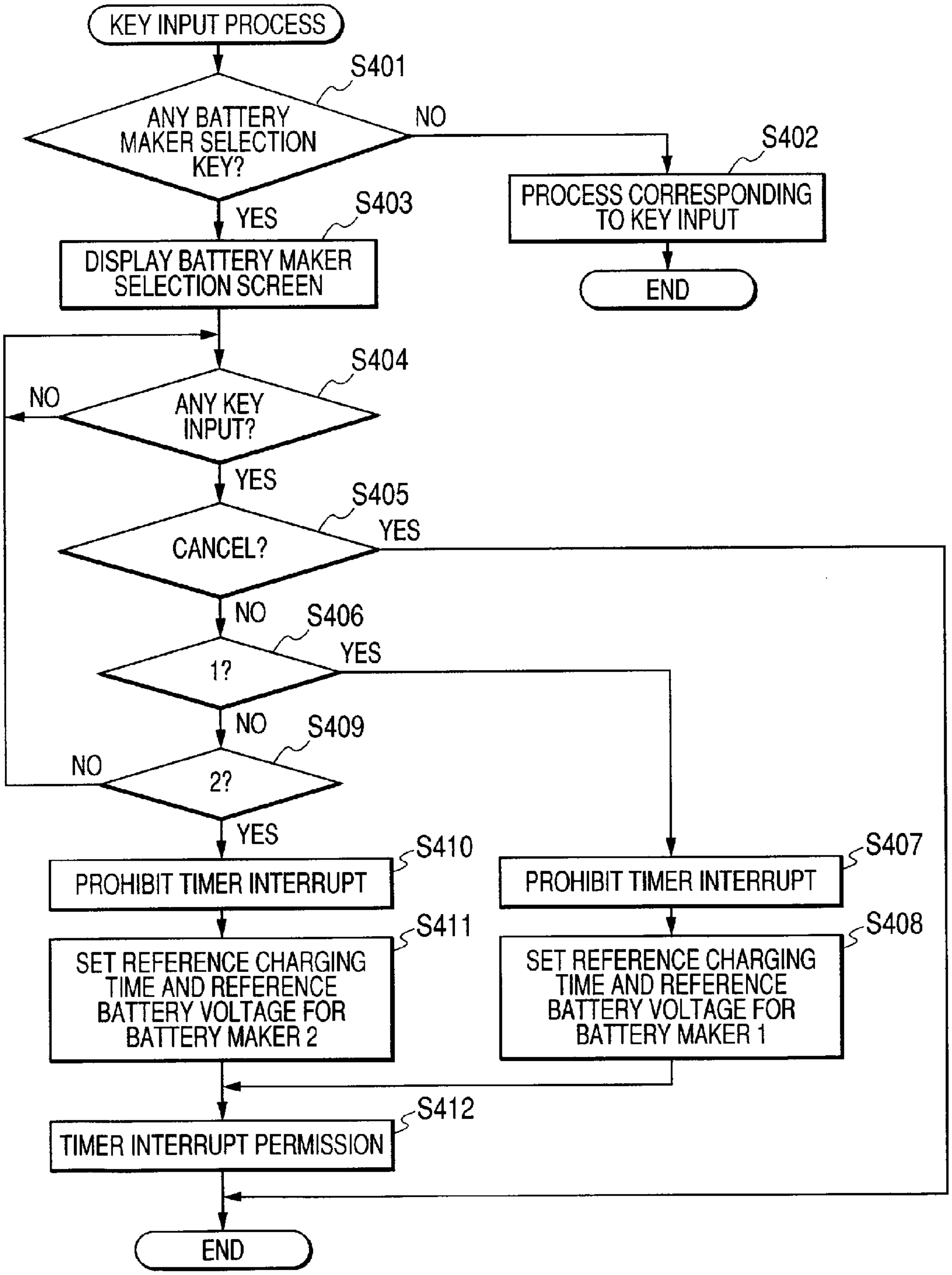
FIG. 8 is a flowchart of a key input process.

At S305, when any input operation is performed in the operation part 33, the procedure transfers to S306 to perform a key input process for making a process corresponding to the input operation in the operation part 33, and the procedure returns to S301. The specific contents of the key input process will be described later (FIG. 8).

On the other hand, at S305, when any input operation is not performed in the operation part 33, the procedure transfers to S307 to determined whether or not the secondary battery 43 is being charged. Specifically, when the voltage inputted into the charging stand detecting port P1 is at low level, it is determined that the charging voltage from the charging stand 20 is applied to the charging terminal 34, or conversely, when the voltage inputted into the charging stand detecting port P1 is at high level, it is determined that the charging voltage from the charging stand 20 is not applied to the charging terminal 34.

At S307, if the secondary battery 43 is not being charged, the procedure transfers to S308, where the display screen of the display part 32 is the display screen representing the idling (e.g., mobile number, weekday, time and battery remaining amount indication). Then, the procedure returns to S301.

At S307, when the secondary battery 43 is being charged, the procedure transfers to S309 to determine whether or not he charge failure flag is set (i.e., the charging is not normally performed). The charging failure flag is set (S505) when it is determined that the charging is not normally performed (S503: NO, S504: YES) in a timer interrupt process (FIG. 9) as will be described later.

At S309, when the charging flag is not set (i.e., the charging is normally performed), the procedure transfers to S310, where the display screen of the display part 32 is changed to the display screen indicating the charging (e.g., screen with a message "charging" in the item on the display screen indicating the waiting) Then, the procedure returns to S301. The LED may be lighted.

On the other hand, at S309, when the charging flag is set (i.e., the charging is not normally performed), the procedure transfers to S311, where a charge failure warning indication (e.g., a message "clean the charging terminal") is displayed on the display screen of the display part 32. Then, the procedure returns to S301.

Referring to a flowchart of FIG. 8, a key input process performed at S306 in the main process (FIG. 7) will be described below.

When this key input process is started, first of all, a determination is made at S401 whether or not a battery maker selection key in the operation part 33 is depressed. The battery maker selection operation may be made by manipulating a general-purpose key in the operation part 33, rather than a dedicated key in the operation part 33.

At S401, when the battery maker selection key is not depressed (i.e., any other key than the battery maker selection key is depressed), the procedure transfers to S402, where a well-known process corresponding to the depressed key is performed, and this key input process is ended.

On the other hand, at S401, when the battery maker selection key is depressed, the procedure transfers to S403, where a battery maker selection screen is displayed on the display part 32. Specifically, the user is prompted on the display to perform an input operation of selecting the battery maker of the used secondary battery 43 with "1" or "2", such as "Battery maker? 1: A company 2: B company".

At S404, a determination is made whether or not the input operation is performed in the operation part 33. When the input operation is performed the procedure transfers to S405.

At S405, a determination is made whether or not the input operation performed in the operation part 33 is a cancel operation (e.g., an operation of depressing the "off"0 key).

At S405, when the input operation is the cancel operation, this key input process is directly ended.

On the other hand, at S405, when the input operation is the cancel operation, the procedure transfers to S406 to determine whether the input operation performed in the operation part 33 is the operation of depressing the "1" key (i.e., whether or not the A company of the first maker is selected).

At S405, when the input operation is the operation of depressing the "1" key, the procedure transfers to S407, where a timer interrupt process (FIG. 9) is prohibited.

At S408, the reference charging time T1 and the reference battery voltage V1 for the battery maker (first maker) corresponding to the number "1", which are stored in the EEPROM 54, are read, and stored as the determination reference values in the RAM 62. That is, a process of rewriting the reference charging time T and the reference battery voltage B already stored as the determination reference values in the RAM 62 is performed. Then, the procedure transfers to S412.

On the other hand, at S405, when the input operation is not the operation of depressing the "1" key, the procedure transfers to S409 to determined whether or not the input operation performed in the operation part 33 is the operation of depressing the "2" key (i.e., whether or not the B company of the second maker is selected).

At S409, when the input operation is not the operation of depressing the "2" key, the procedure returns to S404. That is, the procedure waits till any of the cancel operation and the operations of depressing the "1" key and the "2" is performed.

On the other hand, at S409, when the input operation is the operation of depressing the "2", the procedure transfers to S410, where the timer interrupt process (FIG. 9) is prohibited.

At S411, the reference charging time T2 and the reference battery voltage V2 for the battery maker (second maker) corresponding to the number "2", which are stored in the EEPROM 54, are read, and stored as the determination reference values in the RAM 62. That is, a process of rewriting the reference charging time T and the reference battery voltage V stored as the determination reference values in the RAM 62 is performed. Then, the procedure transfers to S412.

At S412, the timer interrupt process (FIG. 9) prohibited at S410 is permitted. That is, the timer interrupt process is disabled during the rewrite process of the reference charging time T and the reference battery voltage V. Thereafter, this key input process is ended.

Figure 9:
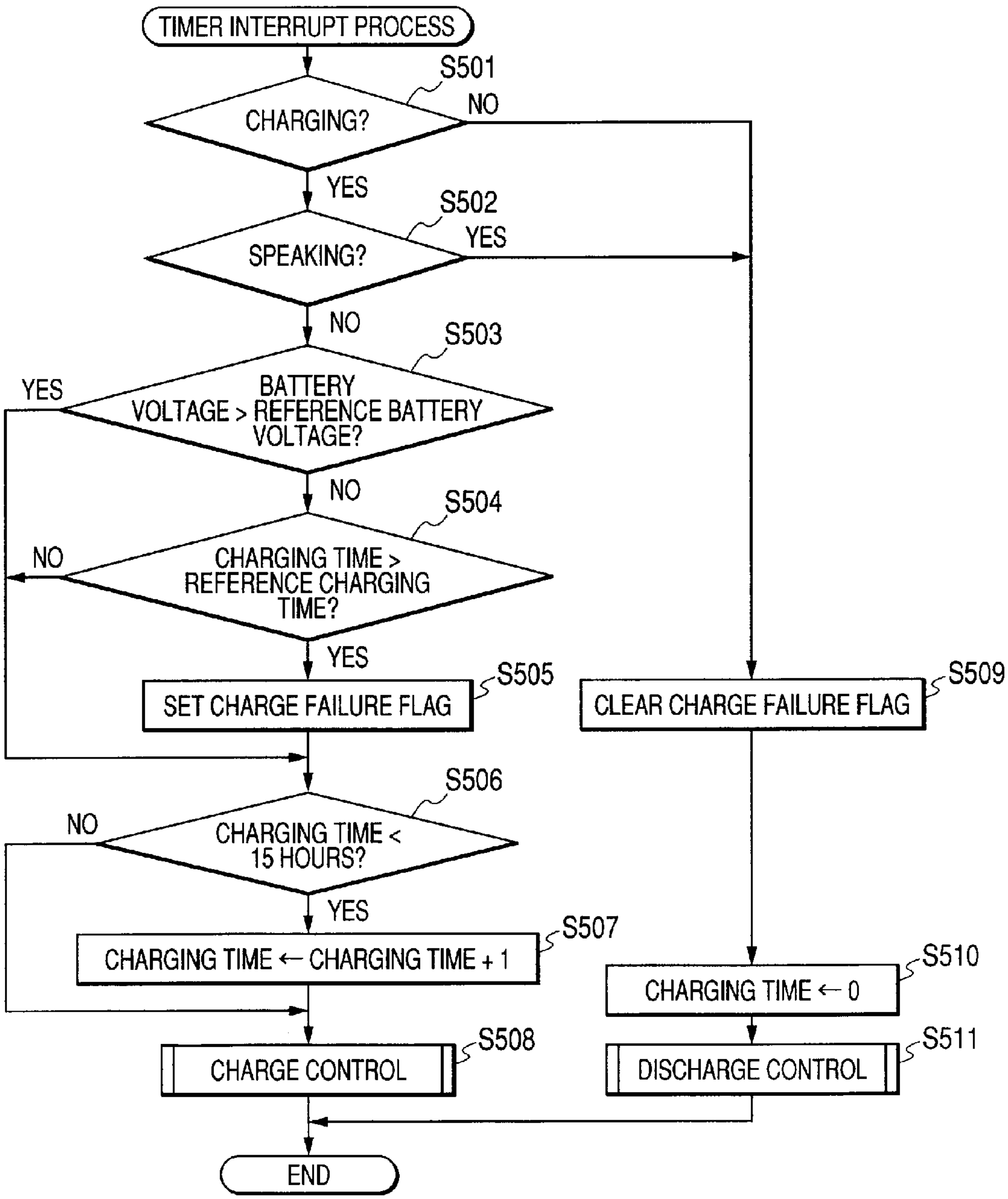
FIG. 9 is a flowchart of a timer interrupt process.

Referring to a flowchart of FIG. 9, a timer interrupt process performed by the CPU 60 upon interruption at a predetermined period (e.g., one second) based on the timer 63 will be described below.

When this timer interrupt process is started, first of all, a determination is made whether or not the secondary battery 43 is being charged at S501. Specifically, when the voltage inputted into the charging stand detecting port P1 is at low level, it is determined that the charging voltage is applied from the charging stand 20 to the charging terminal 34, or conversely, when the voltage inputted into the charging stand detecting port P1 is at high level, it is determined that the charging voltage is not applied from the charging stand 20 to the charging terminal 34.

At S501, when the secondary battery 43 is being charged, the procedure transfers to S502 to determine whether or not the mobile device 30 is speaking (i.e., the mobile device 30 is laid on the charging stand 20 during conversation).

At S502, when the mobile device 30 is not speaking (i.e., normal charging state), the procedure transfers to S503 to determine whether or not the voltage of the secondary battery 43 is greater than the reference battery voltage V. Specifically, a determined is made whether or not the value (digital value indicating the voltage of the secondary battery 43) inputted into the battery voltage port P3 and A/D converted by the AD converter 64 is greater than the reference battery voltage V stored as the determination reference value in the RAM 62.

At S503, when the voltage of the secondary battery 43 is not greater than the reference battery voltage V (i.e., less than or equal to the reference battery voltage V), the procedure transfers to S504 to determine whether or not the charging time Tc (the value of counting the time for which the charging voltage is continually applied from the charging stand 20) is greater than the reference charging time T stored as the determination reference value in the RAM 62.

At S504, when the charging time Tc is greater than the reference charging time T (i.e., the voltage of the secondary battery 43 does not reach the reference battery voltage V even though the charging is performed continually for the reference charging time T), the charging is not normally made, whereby the charge failure flag is set. Then, the procedure transfers to S506.

On the other hand, when the voltage of the secondary battery 43 is greater than the reference battery voltage V at S503, or it the charging time Tc is smaller than the reference charging time T at S504, the procedure directly transfers to S506.

At S506, a determination is made whether or not the charging time Tc is smaller than 15 hours.

At S506, when the charging time Tc is smaller than 15 hours, the procedure transfers to S507 to increment the charging time Tc (add 1 to the charging time Tc). Then, the procedure transfers to S508.

On the other hand, at S506, when the charging time Tc is not smaller than 15 hours (i.e., the charging time Tc is 15 hours or more), the procedure directly transfers to S508.

Figure 10:
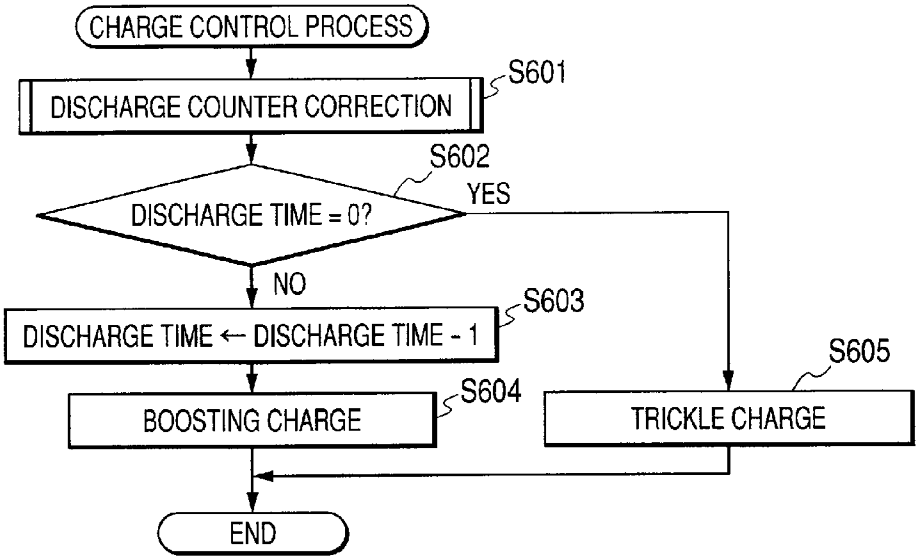
FIG. 10 is a flowchart of a charging control process.

At S508, the charging control for charging the secondary battery 43 is made. Thereafter, this timer interrupt process is ended. The specific contents of a charging control process will be described later (FIG. 10).

On the other hand, when the secondary battery 43 is not being charged at S501, or if the mobile device 30 is speaking at S502, the procedure transfers to S509 to clear the charge failure flag.

At S510, the value of the charging time Tc is reset to 0.

Figure 11:
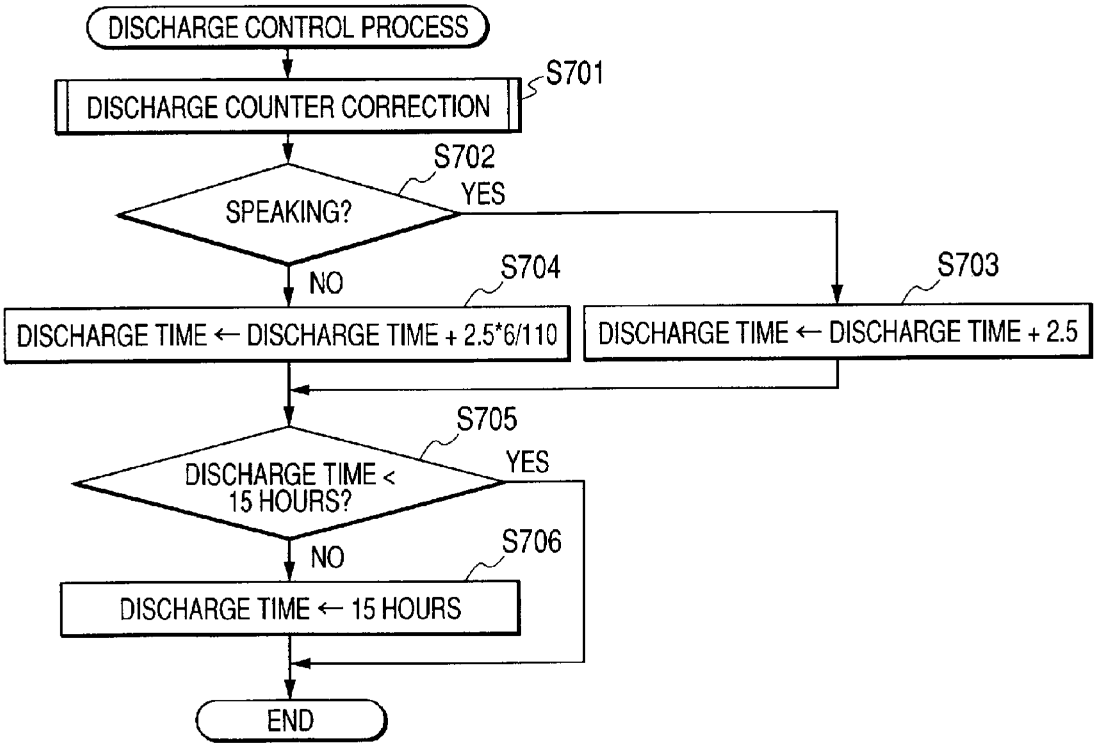
FIG. 11 is a flowchart of a discharging control process.

At S511, the discharge control for managing the value of the discharge time Td in non-charged state is made. Thereafter, this timer interrupt process is ended. The specific contents of a discharge control process will be described later (FIG. 11).

Referring to a flowchart of FIG. 10, the charge control process performed at S508 in the timer interrupt process (FIG. 9) will be described below.

Figure 12:
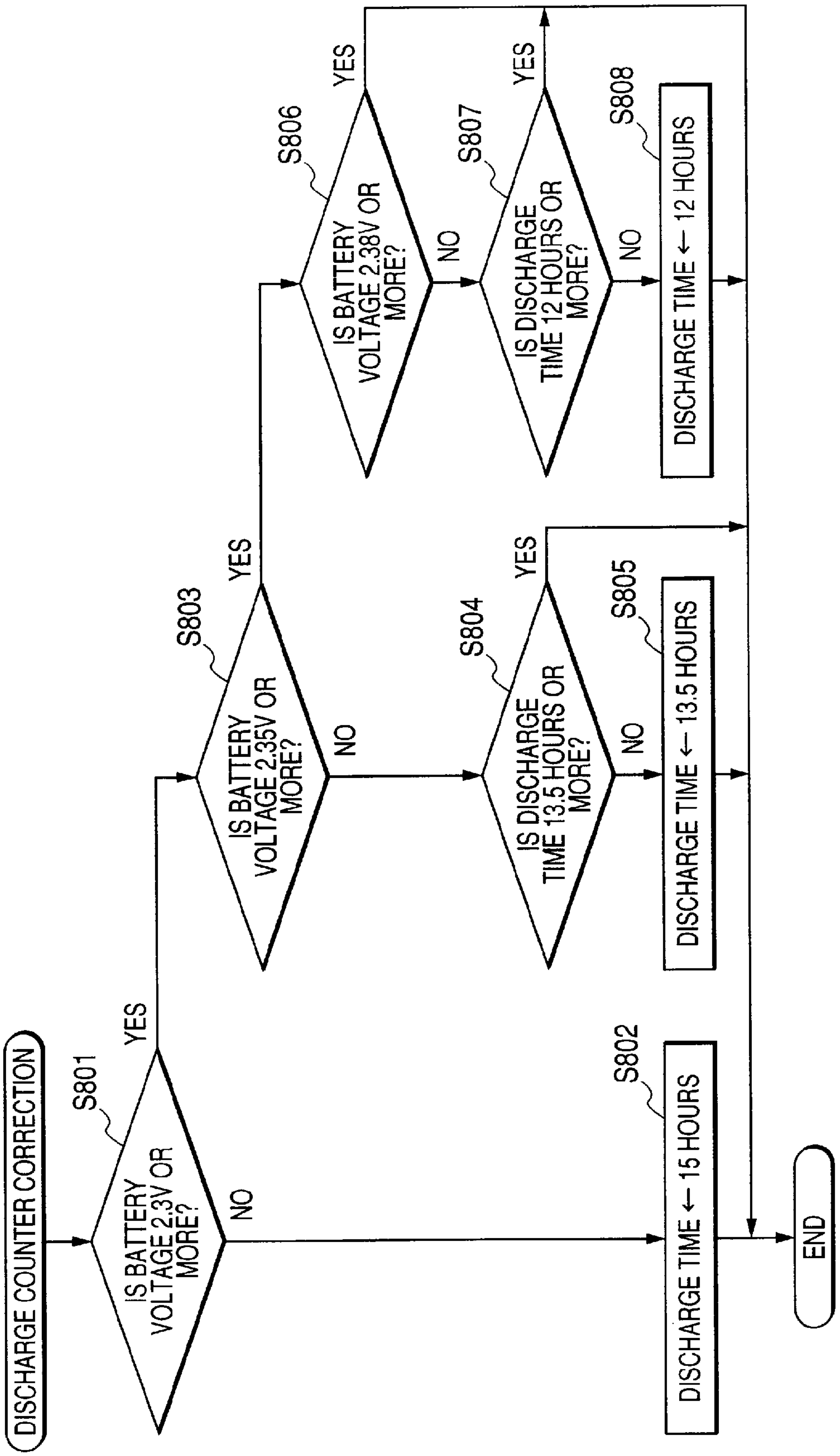
FIG. 12 is a flowchart of a discharging counter correction process.

When this charge control process is started, first of all, a discharge counter correction process for correcting the value of the discharge time Td is performed at S601. The specific contents of the discharge counter correction process will be described later (FIG. 12).

At S602, a determination is made whether or not the discharge time Td (the value indicating the discharge amount of the secondary battery 43) is 0 (i.e., whether or not the secondary battery 43 is in the full charged state).

And at S602, when the discharge time Td is not 0 (in the full charge state), the procedure transfers to S603 to decrement the discharge time Td (subtract 1 from the discharge time Td).

At S604, the secondary battery 43 is subjected to boosting charge. Specifically, the output voltage of the trickle charge switching port P4 is put at high level. Thereby, when the output voltage of the trickle charge switching port P4 is at low level (as compared with the trickle charge), a large current flows through the secondary battery 43. Thereafter, this charge control process is ended.

On the other hand, at S602, when the discharge time Td is 0 (in the full charged state), the procedure transfers to S605, where the secondary battery 43 is subjected to trickle charge. Specifically, the output voltage of the trickle charge switching port P4 is put at low level. Thereafter, this charge control process is ended.

Referring to FIG. 11, the discharge control process performed at S511 in the timer interrupt process (FIG. 9) will be described below.

When this discharge control process is started, first of all, a discharge counter correction process for correcting the value of the discharge time Td is performed at S701 the specific contents of the discharge counter correction process will be described later (FIG. 12).

At S702, a determination is made whether or not the mobile device 30 is speaking.

When it is determined that the mobile device 30 is speaking at S702, the procedure transfers to 3703 to add 2.5 seconds to the discharge time Td. Thereafter, the procedure transfers to S705.

On the other hand, when it is determined at S702 that the mobile device 30 is not speaking, the procedure transfers to S704 to add 2.5×6/110 seconds to the discharge time Td. Thereafter, the procedure transfers to S705. In this embodiment, 2.5 seconds are added to the discharge time Td during telephone call, based on a criterion that the time required to charge the power consumption due to a telephone call for one second is 2.5 seconds (S703). Also, the value of 2.5 seconds multiplied by 6/110 is added to the discharge time Td while a telephone call is not in progress, based on a criterion that the ratio of the power consumption with telephone call to the power consumption without telephone call is 110:6 (S704). These values are only illustrative.

At S705, a determination is made whether or not the discharge time Td is smaller than 15 hours.

When it is determined at S705 that the discharge time Td is not smaller than 15 hours (i.e., the discharge time Td is greater than or equal to 15 hours), the procedure transfers to S706, where the discharge time Td is set to 15 hours. Thereafter, this discharge control process is ended.

On the other hand, when it is determined at S705 that the discharge time Td is smaller than 15 hours, this discharge control process is directly ended.

Referring to a flowchart of FIG. 12, the discharge counter correction process performed at S601 in the charge control process (FIG. 10) and at S701 in the discharge control process (FIG. 11) will be described below.

When this discharge counter correction process is started, first of all, a determination is made at S801 whether or not the voltage of the secondary battery 43 is 2.3V or more. Specifically, a determination is made whether or not the value (digital value indicating the voltage of the secondary battery 43) inputted into the battery voltage port P3 and A/D converted by the AD converter 64 is greater than or equal to the digital value indicating 2.3V, which is stored in the RAM 62.

When it is determined that the voltage of the secondary battery 43 is not 2.3V or more (less than 2.3V) at S801, the procedure transfers to S802 to correct the discharge time Td to 15 hours, and this discharge counter correction process is ended.

On the other hand, when it is determined at S801 that the voltage of the secondary battery 43 is 2.3V or more, the procedure transfers to S803 to determine whether or not the voltage of the secondary battery 43 is 2.35V or more. Specifically, a determination is made whether or not the value (digital value indicating the voltage of the secondary battery 43) inputted into the battery voltage port P3 and A/D converted by the AD converter 64 is greater than or equal to the digital value indicating 2.35V, which is stored in the RAM 62.

When it is determined that the voltage of the secondary battery 43 is not 2.35V or more (from 2.3V to 2.35V) at S803, the procedure transfers to S804 to determine whether or not the discharge time Td is 13.5 hours or more.

When it is determined that the discharge time Td is 13.5 hours or more at S804, this discharge counter correction process is directly ended.

On the other hand, when it is determined that the discharge time Td is not 13.5 hours or more (i.e., less than 13.5 hours) at S804, the procedure transfers to S805 to correct the discharge time Td to 13.5 hours, and this discharge counter correction process is ended.

On the contrary, when it is determined at S803 that the voltage of the secondary battery 43 is 2.35V or more, the procedure transfers to S806 to determine whether or not the voltage of the secondary battery 43 is 2.38V or more. Specifically, a determination is made whether or not the value (digital value indicating the voltage of the secondary battery 43) inputted into the battery voltage port P3 and A/D converted by the AD converter 64 is greater than or equal to the digital value indicating 2.38V, which is stored in the RAM 62.

When it is determined that the voltage of the secondary battery 43 is not 2.38V or more (from 2.35V to 2.38V) at S806, the procedure transfers to S807 to determine whether or not the discharge time Td is 12 hours or more.

When it is determined at S807 that the discharge Td is 12 hours or more, this discharge counter correction process is directly ended.

On the other hand, when it is determined at S807 that the discharge time Td is not 12 hours or more (i.e., less than 12 hours), the procedure transfers to S808 to correct the discharge time Td to 12 hours, and this discharge counter correction process is ended.

On the contrary, when it is determined at S806 that the voltage of the secondary battery 43 is 2.38V or more, this discharge counter correction process is directly ended.

As described above, in the mobile device 30 of this embodiment, if it is determined that the voltage of the secondary battery 43 does not reach the reference battery voltage V even though the secondary battery 43 is charged continually for the reference charging time T (S503: NO, S504: YES), a charge failure warning indication is displayed on the display part 32 to inform the user of an abnormal condition (S505, S309: YES, S311). Therefore, in the mobile device 30 of this embodiment, if the secondary battery 43 is not normally charged, even though the charging voltage is applied, due to dirt on the charging terminals 22, 34 for applying the charging voltage, or deterioration of the secondary battery 43 itself, the user is informed of the abnormality to take the measures.

Also, in the mobile device 30 of this embodiment, the reference charging times T1, T2 and the reference battery voltages V1, V2 for the secondary batteries of a plurality of makers are stored in the EEPROM 54, and the user can select the value corresponding to the secondary battery 43 used as the power source from them (FIG. 8), whereby the user can cope with replacement of the secondary battery 43 very easily, when the secondary battery 43 is replaced with a different kind of secondary battery.

Further, in the mobile device 30 of this embodiment, since the reference charging time T and the reference battery voltage V that are values according to the charging characteristics of the secondary battery are stored in the EEPROM 54 that is the storage medium capable of storing the information inputted from the outside, the reference charging time T and the reference battery voltage V can be stored at the shipment from the factory, whereby the mobile device 30 employing a different kind of secondary battery 43 can be made the same constitution. Thereby, the manufacture cost of the mobile device 30 employing the different kind of secondary battery 43 is reduced.

And with this constitution, the mobile device 30 of this aspect can correctly judge whether or not the secondary battery is not normally charged for plural kinds of the secondary battery.

In the mobile device 30 of this aspect, the secondary battery 43 functions as a secondary battery, the display part 32 functions as a notification unit, and the EEPROM 54 functions as a storage unit. Also, the charging stand detection circuit 41 and S501 in the timer interrupt process (FIG. 9) function as a charged state determination unit, the battery voltage detection circuit 44 functions as a voltage detection unit, S311 in the main process (FIG. 7) functions as a notification control unit, and the operation part 33 and S406 to S412 in the key input process (FIG. 8) function as a selection unit.

Though one aspect of the invention has been described above, various modifications may be made thereto.

That is, in the mobile device 30 of this aspect, if it is determined that the secondary battery 43 is not normally charged, a message is displayed on the display part 32 to inform the user of the abnormal condition. However, the user may be informed of the abnormal condition before the remaining amount indication of the display part 32 becomes 3, for example. Also, the user may be informed of the abnormal condition in terms of the output of sound such as voice or buzzer.

Also, in the mobile device 30 of this aspect, the reference charging times T and the reference battery voltages V for the secondary batteries of a plurality of makers are stored in the EEPROM 54. However, the reference charging time T and the reference battery voltage V for one kind of secondary battery may be stored in the EEPROM 54. With this constitution, the reference charging time T and the reference battery voltage V are stored at the shipment from the factory, whereby the mobile device 30 employing a different kind of secondary battery 43 can be made the common constitution. Also, even when the secondary battery 43 is replaced with different kind of secondary battery, the reference charging time T and the reference battery voltage V stored in the EEPROM 54 can be rewritten. It is preferred that the reference charging times T and the reference battery voltages V for plural kinds of secondary battery are stored in the respect that the secondary battery 43 can be replaced with a different kind of secondary battery by an input operation of the user very easily.

Moreover, in the mobile device 30 of this aspect, the reference charging times T and the reference battery voltages V of the secondary batteries for a plurality of makers are stored in the EEPROM 54 capable of storing the information inputted from the outside. However, they may be stored beforehand in the ROM 61 that is the storage medium incapable of writing information. Thereby, the mobile device 30 employing any one of the secondary batteries for a plurality of makers stored in the ROM 61 can have the common constitution. Also, if the secondary battery 43 is replaced with a different kind of secondary battery, the user can cope with the replacement by an input operation very easily. However, it is preferred that the storage medium capable of storing the information inputted from the outside such as EEPROM is employed in the respect that the there is a broader range of the secondary battery to be treated.

On the other hand, this invention may be applied to the portable telephone set, digital camera, portable music reproducer, PDA, or the electronic apparatus having the secondary battery chargeable by applying the charge voltage from the outside, besides the mobile device of the telephone set.

What is claimed is:

1. An electronic apparatus comprising:

a battery being chargeable by applying a charging voltage;

a notification unit that notifies information;

a storage unit that stores a battery voltage determination threshold value used to determine a remaining charge of the battery;

a voltage detection unit that detects a voltage of the battery;

a detected voltage write unit that, when a predetermined voltage is applied, stores the voltage detected by the voltage detection unit as the battery voltage determination threshold value;

a controller that measures a length of time which the battery has not been charged by executing a timer interrupt process;

a notification control unit that determines the remaining charge of battery based on the voltage of the battery detected by the voltage detection unit, the battery voltage determination threshold value stored in the storage unit, and a charging time required to maximize the charge of the battery, and controls the notification unit to make a notification indicating the remaining charge of the battery, wherein the charging time required to maximize the charge of the battery is calculated using the voltage of the battery detected by the voltage detection unit and the length of time over which the battery has not been charged, wherein the charging time required to maximize the charge of the battery is further calculated by adding a discharge time calculated based on the length of time over which the battery has not been charged, to a time corresponding to the voltage of the battery detected by the voltage detection unit when the electronic apparatus is turned on, and wherein the charging time required to maximize the charge of the battery is periodically adjusted based on the voltage of the battery detected by the voltage detection unit.

2. The electronic apparatus according to claim 1, wherein the notification control unit calculates a plurality of determination reference values based on the battery voltage determination threshold value stored in the storage unit and determines the remaining charge of the battery in a plurality of stages.

3. The electronic apparatus according to claim 1, wherein the charging time required to maximize the amount of the battery is calculated by adding a discharge time, calculated based on the length of time over which the battery has not been charged and a state of the electronic apparatus, to a time corresponding to the voltage of the battery detected by the voltage detection unit.

4. The electronic apparatus according to claim 1, wherein the electronic apparatus is a telephone apparatus.

* * * * *